United States Patent [19]

Itagaki

[11] 4,438,528
[45] Mar. 20, 1984

[54] CHANNEL SELECTION SYSTEM FOR AN ELECTRONIC TUNER

[75] Inventor: Tsuguo Itagaki, Kamakura, Japan
[73] Assignee: Hitachi, Ltd., Tokyo, Japan
[21] Appl. No.: 404,649
[22] Filed: Aug. 3, 1982
[30] Foreign Application Priority Data

Aug. 6, 1981 [JP] Japan .................. 56-122497

[51] Int. Cl.³ .............................................. H04B 1/26
[52] U.S. Cl. ........................................ 455/182; 455/183; 455/164; 455/165
[58] Field of Search .............. 455/164, 165, 182, 183, 455/192; 358/195.1

[56] References Cited

U.S. PATENT DOCUMENTS

| | | | |
|---|---|---|---|
| 4,280,140 | 7/1981 | Skerlos | 455/182 |
| 4,367,558 | 1/1983 | Gercekci et al. | 455/183 |
| 4,387,469 | 6/1983 | Miyazaki et al. | 455/165 |
| 4,397,038 | 8/1983 | Rzeszewski | 455/182 |

Primary Examiner—Jin F. Ng
Attorney, Agent, or Firm—Antonelli, Terry & Wands

[57] ABSTRACT

In a channel selection system using a PPL frequency synthesizing method in which the local oscillation frequency of a tuner is frequency-divided and compared with the frequency and the phase of a reference oscillator thereby to control the tuning voltage of a tuner, a channel selection system disclosed by this invention comprises a controller, a variable frequency divider the frequency division ratio of which is controlled by the above controller, an AFC circuit connected to this tuner, a first comparator having a first threshold voltage for detecting an H level of the inverted S character output of the AFC circuit, a second comparator having a second threshold voltage for detecting an L level of the inverted S character output, and a delay circuit connected to the output of at least one of the first and second comparators and delaying the rising edge of the comparison output.

3 Claims, 7 Drawing Figures

CHANNEL SELECTION SYSTEM FOR AN ELECTRONIC TUNER

This invention relates to a channel selection system used in a television receiver, and more particularly to a channel selection system using a PPL frequency synthesizer method.

Usually, in a channel selection system using the PPL frequency synthesizer method, the local oscillation frequency is determined in accordance with the ratio of frequency division prescribed by a fixed frequency-divider or a variable frequency divider. Therefore, if the frequency of a wished channel shifts from a normal frequency, no clear image is obtained due to this frequency shift when an offset signal of e.g. CATV is received or when VTR or a video game is connected to a television receiver. Therefore, for such a system, a channel selection apparatus with an automatic fine adjustment function which can correct the frequency shift automatically has been developed and disclosed in Japanese Patent Publication No. 54-77004.

However, the loop gain of PPL is not constant due to the nonlinearity of a voltage control oscillator. In a channel with a reduced gain, the damping coefficient decreases, whereby the response characteristic is deteriorated. If the automatic fine adjustment is applied to the channel, the pulling action becomes unstable so that a continuous oscillation may happen near the normal receiving frequency. A drawback is therefore that no stable receipt is obtainable.

The objective of this invention is to eliminate the above-mentioned problem in the prior art and to provide a channel selection system capable of a stable operation of the automatic fine adjustment.

According to this invention, if, during receipt of a wished channel, the received channel frequency deviates from the frequency determined by a prescribed frequency division ratio, the output voltage of an AFC circuit is detected with first and second threshold voltages. In a channel selection apparatus where the frequency division ratio in a variable frequency divider is made to vary with the discrimination output voltage lying between the first and second threshold voltages, the frequency division ratio is varied after a constant delayed time but no delay time is introduced when the variation is stopped. In this manner, in the pulling process toward the normal frequency, if the discrimination voltage varies over the voltage difference of the first and second threshold voltages, it is returned within the range between these voltages rapidly and stably.

The present invention will be apparent from the following detailed description taken in conjunction with the accompanying drawings, in which.

Figure 1:
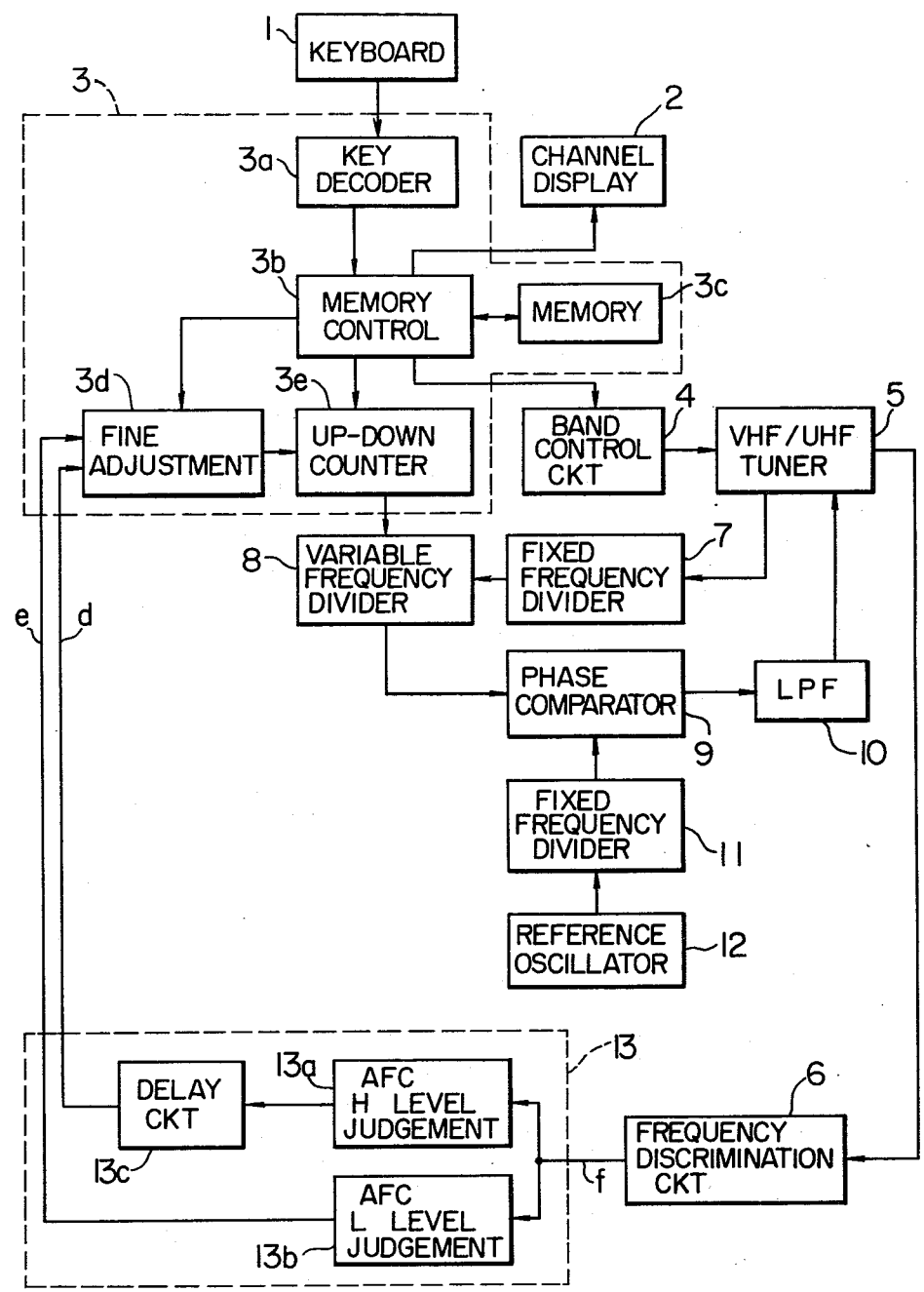
FIG. 1 is a block diagram showing one embodiment of a channel selection system according to this invention.

In FIG. 1, a reference numeral 1 denotes a keyboard for channel selection, 2 a channel display with e.g. two figures, 3 a controller, 4 a band control circuit for controlling the band switching of a tuner, 5 a VHF/UHF tuner, 6 a frequency discrimination circuit, 7 a fixed frequency divider for frequency-dividing the output of a local oscillator of the tuner 5, 8 a variable frequency divider which further frequency-divides the output of the local oscillator divided by the fixed frequency divider 7 and can vary the ratio of frequency division in accordance with the output of the control logic circuit 3, 9 a phase comparator which compares the frequency divided by both the fixed and variable frequency dividers 7 and 8 with a reference frequency and generates an error output in order that these frequencies become equal to each other, 10 a low pass filter which takes out a d.c. component from the error voltage of the phase comparator 9, 11 a fixed frequency divider which frequency-divides the output of a reference oscillator 12, and 13 an AFC discrimination circuit which compares the AFC voltage generated by the discrimination circuit 6 with the first and second threshold voltages and generates a detection signal.

The controller 3 comprises a key decoder 3a, a memory controlling circuit 3b, a memory 3c, a fine adjustment control circuit 3d and an up-down counter 3e. The AFC discrimination circuit 13 comprises an AFC H level judgement circuit 13a, an AFC L level judgement circuit 13b, and a delay circuit 13c.

Now, explanation will be made of the operation of the circuit. With an input of a channel number from a channel selection keyboard 1, the number is decoded by the decoder 3a and introduced into the memory control circuit 3b. The memory control circuit 3b reads out data corresponding to the channel number from the memory 3c and sends them to the up-down counter 3e. In the up-down counter 3e, the inital setting of the count value is made in accordance with the above data. The count value of the up-down counter 3e is sent to the variable frequency divider 8. The ratio of frequency division of the variable frequency divider 8 is determined by this count value.

The AFC output voltage f of the discrimination circuit 6 is sent to both the AFC H level judgement circuit 13a having a first threshold voltage and the AFC L level judgement circuit 13b having a second threshold voltage. When the AFC output voltage f becomes larger than or equal to the first threshold voltage, an H level voltage is generated from the AFC H level judgement circuit 13a. When the voltage f becomes less than or equal to the second threshold voltage, an H level voltage is generated form the AFC L level judgement circuit 13b. The output of the AFC H level judgement circuit 13a is connected to the delay circuit 13c. This delay circuit 13c delays the output of the AFC H level judgement circuit 13a by a constant time when the output changes from the low (L) to the high (H) level, while performs no delay for a change from H to L level.

When the output d of the delay circuit 13c is at H level, the fine adjustment control circuit 3d sends a signal to the up-down counter 3e so that the counter counts up. When the output e of the AFC L level judgement circuit 13b is at H level, the fine adjustment control circuit 3d sends a signal to the up-down counter 3e so that the counter counts down. When both outputs of the AFC H level and L level judgement circuits 13a and 13b are at L level, the up-down counter stops counting and holds its count value.

Figure 2:
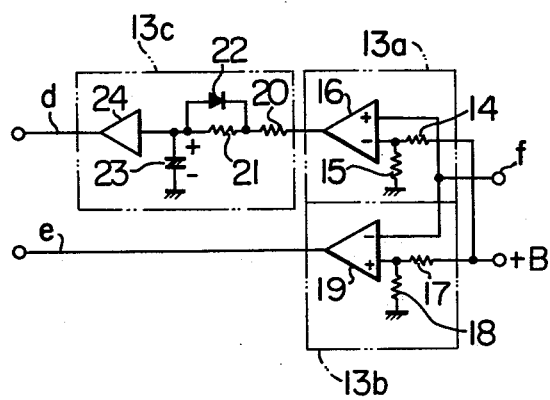
FIG. 2 is a circuit diagram showing one concrete example of an AFC H level judgement circuit for AFC, an AFC L level judgement circuit for AFC, and a delay circuit.

FIG. 2 shows one concrete example of AFC H level judgement circuit 13a, AFC L level judgement circuit 13b and the delay circuit 13c. The AFC H level judgement circuit 13a comprises bias resistors 14 and 15 for determining the first threshold voltage and a comparator 16. The AFC L level judgement circuit 13b comprises bias resistors 17 and 18 for determining the second threshold voltage and a comparator 19. The delay circuit 13c comprises a condenser 23, resistors 20 and 21 for determining the charge and discharge time constants for the condenser 23, a diode 22 for setting the discharge time constant of the condenser 23 shorter than the charge time constant thereof, and a buffer 24.

In this circuit, when the AFC voltage f becomes larger than or equal to the first threshold voltage, the output of the comparator 16 changes from L to H level and the voltage across the condenser 23 rises with a time constant determined by the resistors 20 and 21 and the condenser 23. When this voltage becomes larger than or equal to the threshold voltage of the buffer 24, the output d of the buffer 24 changes from L to H level. Namely, the output d of the buffer 24 is delayed from the output variation of the comparator 16 by a time determined by the above time constant. On the other hand, when the AFC voltage f becomes less than or equal to the first threshold voltage, the voltage across the condenser 23 falls with a time constant determined by the resistor 20 and the condenser 23. In this case, by choosing the value of the resistor 20 sufficiently small, the output variation of the buffer 24 follows substantially that of the comparator 16.

Further, when the AFC voltage f becomes less than or equal to the second threshold voltage, the output e of the comparator 19 changes from L to H level. When the AFC voltage f becomes larger than or equal to the second threshold voltage, the output e changes from H to L level.

Next, explanation will be made of an embodiment of this invention in conjunction with FIG. 1. When a channel number is supplied from the channel selection keyboard 1, data corresponding to the channel are sent to the variable frequency divider 8 by the controller 3 through the operation as described with reference to FIG. 2. The ratio of frequency division corresponding to the selected channel is set in the variable frequency divider 8. Further, by the feedback through a phase synchronization loop formed by the fixed frequency divider 7, the variable frequency divider 8, the phase comparator 9 and the low pass filter 10, the local oscillation frequency of the tuner 5 is set at a frequency corresponding to a wished channel.

Figure 3:
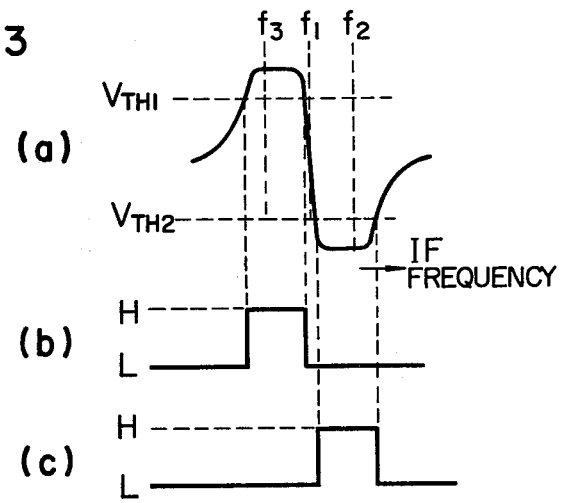
FIG. 3 shows waveforms of the main parts of FIG. 2.

Description will be made of a case when the frequency of the received channel is deviating from the normal frequency as set in the above-mentioned manner. Usually, the output voltage characteristic of the frequency discrimination circuit draws an inverted S character against frequency, as shown in FIG. 3(a), where the abscissa is the IF frequency and the ordinate is the output voltage.

Now, assume that the IF video carrier frequency $f_2$ is shifted toward a higher side of the normal frequency $f_1$ and that the degree of deviation is within a flat part of the curve. Then, the output voltage of the discrimination circuit 6 is lower than the second threshold voltage $V_{TH2}$, and the output e of the comparator 19 becomes H level, as shown in FIG. 3(c) when this H level signal is supplied to the controller 3, the fine adjustment control circuit 3d contained in the controller 3 forces the up-down counter 3e to count down. The output of the up-down counter 3e is decreased from the initial value given by an input from the keyboard 1. The ratio of frequency division of the variable frequency divider is also decreased. As the result, the IF image carrier frequency $f_2$ as determined by this ratio of frequency division is varied to a lower value. When the frequency approaches the normal frequency $f_1$ and the AFC voltage exceeds the second threshold voltage $V_{TH2}$, the up-down counter stops counting.

Figure 4:
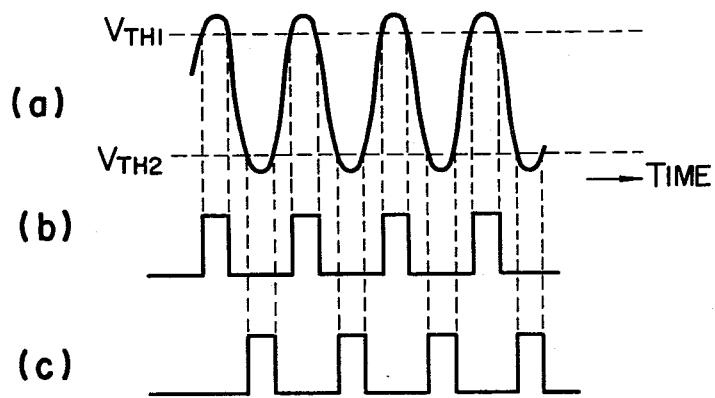
FIGS. 4 and 5 are time charts of the main part of FIG. 2 against the variation of the discrimination output voltage.

However, in a channel with a reduced PLL loop gain, the damping coefficient is decreased and hence the response characteristic is worsened. Therefore, when the tuning voltage of the tuner 5 approaches the tuning voltage corresponding to the above-mentioned normal frequency, it oscillates. Even if the variation of the frequency division ratio stops at a time $t_1$, the oscillation still continues. Thus, the discrimination output voltage oscillates with the above oscillation period, as shown in FIG. 4(a).

Now, let us consider a case where the detection by the comparators 16 and 19 is done without any temporal delay. If the discrimination output voltage oscillates with a peak value above the threshold voltage $V_{TH1}$ and a peak value below the threshold voltage $V_{TH2}$, the afore-mentioned fine adjustment control occasionally maintains such an oscillation. Now, FIG. 4(b) shows the output of the comparator 16 and FIG. 4(c) shows the output variation of the comparator 19. In such a case, since the local oscillation frequency also varies periodically, the screen may be disturbed.

Figure 5:
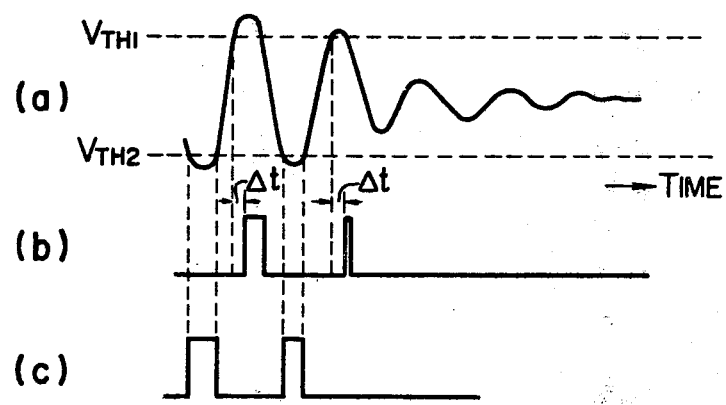

If the output variation of the comparator 16 is delayed, as described in the present embodiment, the output d of the delay circuit 13c connected to the comparator 16 appears delayed by $\Delta t$, as shown in FIG. 5(b). This results in a gradual narrowing of the output pulse width with time. Correspondingly, the output pulse width of the comparator 19 is also narrowed, as shown in FIG. 5(c). Due to this, the oscillation of the discrimination output voltage is attenuated gradually and stabilized in a short time.

We can see that the same operation will happen when the IF video carrier frequency $f_3$ of the received channel is deviating to a lower side of the normal frequency $f_1$.

Figure 6:
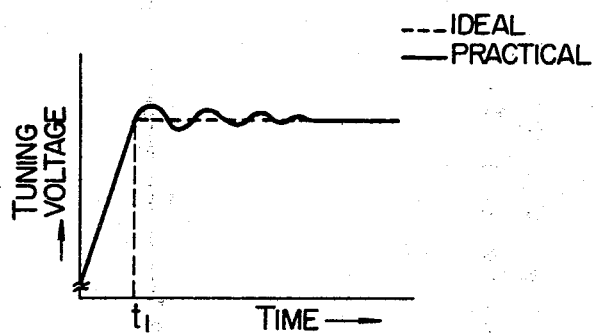
FIG. 6 is a diagram showing a variation of the tuning voltage.

Description will be made of a case where the frequency of the received channel is equal to the normal frequency $f_1$. When the channel is switched from a lower frequency channel to a higher frequency one, the variation of the tuning voltage of the tuner 5 behaves as shown in FIG. 6. The voltage approaches a tuning voltage corresponding to the normal frequency in an oscillating way. If the oscillation is too large, the aforementioned phenomenon happens. Namely, the discrimination output voltage oscillates. In the prior art circuit system, this oscillation continues. However, according to this invention, since the output variation of the comparator 16 is delayed, the oscillation of the discrimination output voltage is attenuated rapidly due to the above-described reason, and stabilized in a short time. Therefore, the variation of the tuning voltage is also stabilized rapidly.

Although, in the above embodiment, the delay circuit 13c is provided on the output side of the comparator 16, the circuit may be provided on the output side of the comparator 19 or on the output side of both comparators 16 and 19.

Figure 7:
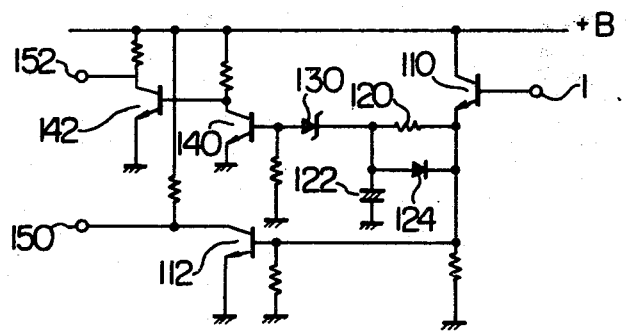
FIG. 7 is a circuit diagram showing another example of the level discrimination circuits and the delay circuit.

Alternatively, as shown in FIG. 7, the delay circuit and the level judgement circuit may be replaced. In FIG. 7, when the discrimination voltage of FIG. 3(a) appearing at the emitter of a transistor 110 is less than or equal to the second threshold voltage $V_{TH2}$, a transistor 112 is turned off and the second control signal of FIG. 3(c) is obtained at an output terminal 150. An integration circuit made of a resistor 120 and a condenser 122 causes a delay in the transmitted signal, while no delay for a variation of the signal in the falling direction because of a diode 124 connected in parallel with the integration circuit. By the presence of a Zener diode 130 provided between the base of a transistor 140 and the resistor 120, the transistor 140 is turned on while a transistor 142 is turned off at a voltage larger than or equal to the first threshold voltage $V_{TH1}$ so that a first control signal as shown in FIG. 5(b) is obtained at a terminal 152.

As described above, according to this invention for a system where an automatic correction is made for a shift of the frequency of a wished channel from the normal receiving frequency determined by a prescribed frequency division ratio, the automatic fine adjustment function can be operated stably and a continuous stable receipt is attained.

What is claimed is:

1. A channel selection system comprising:
   (a) a tuner having a local oscillator and a mixer for mixing the output of said local oscillator and a received signal and generating an intermediate frequency signal,
   (b) a variable frequency divider for frequency-dividing the output of said local oscillator and either increasing or decreasing the ratio of frequency division in accordance with a control signal,
   (c) a reference oscillator,
   (d) a phase comparator for comparing the phases of the output of said variable frequency divider and the output of said reference oscillator and feeding a comparison output back to said local oscillator thereby to keep phase synchronization between said both outputs,
   (e) a frequency discriminator for receiving said intermediate frequency signal and generating a discrimination signal corresponding to a difference between the frequency of said intermediate frequency signal and a reference frequency,
   (f) a first control circuit for supplying to said variable frequency divider a first control signal for either increasing or decreasing the frequency division ratio of said variable frequency divider so that said discrimination signal approaches its center value when said discrimination signal is larger than a first prescribed value,
   (g) a second control circuit for supplying to said variable frequency divider a second control signal for causing a variation of the frequency division ratio opposite to the variation given by said first control signal when said discrimination signal is less than a second prescribed value, and
   (h) a delay circuit provided between at least one of said first and second control circuits and said variable frequency divider and for causing a delay at the rise time of at least one of said first and second control signals while causing no delay at the falling time of said at least one control signal signal.

2. A channel selection system according to claim 1, wherein said delay circuit comprises an integration circuit and a diode connected in parallel with said integration circuit.

3. A channel selection system comprising:
   (a) a tuner having a local oscillator and a mixer for mixing the output of said local oscillator and a received signal and generating an intermediate frequency signal,
   (b) a variable frequency divider having a control terminal for frequency-dividing the output of said local oscillator, the ratio of frequency division varying in the direction of either increasing or decreasing in accordance with a control voltage supplied to said control terminal,
   (c) a reference oscillator,
   (d) a phase comparator for comparing the phases of the output of said variable frequency divider and the output of said reference oscillator and feeding a comparison output back to said local oscillator thereby to keep phase synchronization between said both outputs,
   (e) a frequency discriminator for receiving said intermediate frequency signal and generating a discrimination signal corresponding to a difference between the frequency of said intermediate frequency signal and a reference frequency,
   (f) a first means for causing a temporal delay at the rise time of said discrimination signal while no substantial delay at the falling time thereof, detecting an excess of said discrimination signal over a first prescribed value and supplying, during this detection time, to said control terminal of said variable frequency divider a voltage which varies the frequency division ratio of said variable frequency divider in such a direction that said discrimination signal approaches its center value, and
   (g) a second means for supplying to said control terminal of said variable frequency divider a voltage which causes a variation of the frequency division ratio opposite to the variation given by said first means when said discrimination signal is less than or equal to a second prescribed value lower than said first prescribed value.

* * * * *